United States Patent
Lee et al.

(10) Patent No.: US 7,936,066 B2
(45) Date of Patent: May 3, 2011

(54) FLEXIBLE FILM AND DISPLAY DEVICE COMPRISING THE SAME

(75) Inventors: Sang Gon Lee, Cheongju-si (KR); Dae Sung Kim, Seoul (KR); Woo Hyuck Chang, Seoul (KR)

(73) Assignee: LG Electronics Inc., Seoul (KR)

( * ) Notice: Subject to any disclaimer, the term of this patent is extended or adjusted under 35 U.S.C. 154(b) by 95 days.

(21) Appl. No.: 12/125,155

(22) Filed: May 22, 2008

(65) Prior Publication Data

US 2009/0166860 A1    Jul. 2, 2009

(30) Foreign Application Priority Data

Dec. 28, 2007  (KR) .................. 10-2007-0140184

(51) Int. Cl.
*H01L 29/72* (2006.01)
(52) U.S. Cl. ........ 257/750; 257/668; 257/758; 257/756; 257/773; 257/737; 349/150
(58) Field of Classification Search ................. 257/737, 257/750, 758, 759, 773, 668; 349/150
See application file for complete search history.

(56) References Cited

U.S. PATENT DOCUMENTS

| | | | |
|---|---|---|---|
| 3,668,003 A | 6/1972 | Furness | |
| 4,610,756 A | 9/1986 | Strobel | |
| 5,042,919 A | 8/1991 | Yabu et al. | |
| 5,603,158 A | 2/1997 | Murata et al. | |
| 5,975,178 A | 11/1999 | Otsuka et al. | |
| 6,342,932 B1 | 1/2002 | Terao et al. | |
| 6,426,548 B1 | 7/2002 | Mita et al. | |
| 6,433,414 B2 | 8/2002 | Saito | |
| 6,448,634 B1 | 9/2002 | Hashimoto | |
| 7,095,476 B2 | 8/2006 | Lo et al. | |
| 7,492,433 B2 | 2/2009 | Imajo et al. | |
| 7,593,085 B2 * | 9/2009 | Watanabe et al. | 349/150 |
| 2001/0009299 A1 | 7/2001 | Saito | |
| 2003/0024666 A1 | 2/2003 | Suzuki et al. | |
| 2003/0098513 A1 | 5/2003 | Huang | |
| 2004/0140551 A1 | 7/2004 | Usui et al. | |
| 2004/0231878 A1 | 11/2004 | Higashida et al. | |
| 2004/0245628 A1 | 12/2004 | Chung | |
| 2005/0019598 A1 | 1/2005 | Katsuki et al. | |
| 2005/0067739 A1 | 3/2005 | Onodera et al. | |
| 2005/0140876 A1 | 6/2005 | Kubo | |
| 2005/0168304 A1 | 8/2005 | Yamaguchi et al. | |
| 2005/0183884 A1 | 8/2005 | Su | |
| 2006/0042750 A1 | 3/2006 | Usuki et al. | |
| 2006/0060949 A1 * | 3/2006 | Naitoh | 257/668 |
| 2006/0060961 A1 | 3/2006 | Lin et al. | |

(Continued)

FOREIGN PATENT DOCUMENTS

CN     1254105 A     5/2000

(Continued)

*Primary Examiner* — Edward Wojciechowicz
(74) *Attorney, Agent, or Firm* — Birch, Stewart, Kolasch & Birch, LLP

(57) ABSTRACT

A flexible film is provided. The flexible film includes a dielectric film; and a metal layer disposed on the dielectric film, wherein the ratio of the thickness of the metal layer to the thickness of the dielectric film is about 1:3 to 1:10. Therefore, it is possible to improve the peel strength, dimension stability, and tensile strength of a flexible film by limiting the ratio of the thicknesses of a dielectric film and a metal layer of the flexible film.

5 Claims, 6 Drawing Sheets

U.S. PATENT DOCUMENTS

| | | |
|---|---|---|
| 2006/0079029 A1 | 4/2006 | Nakamura |
| 2006/0115670 A1 | 6/2006 | Tanaka et al. |
| 2006/0158120 A1 | 7/2006 | Kim et al. |
| 2006/0163718 A1 | 7/2006 | Kurihara |
| 2007/0023877 A1 | 2/2007 | Yamazaki |
| 2007/0070609 A1 | 3/2007 | Lim et al. |
| 2007/0101571 A1 | 5/2007 | Kataoka et al. |
| 2007/0153427 A1 | 7/2007 | Izumi et al. |
| 2008/0055291 A1 | 3/2008 | Hwang et al. |
| 2008/0251940 A1 | 10/2008 | Lee et al. |
| 2008/0284014 A1 | 11/2008 | Lee et al. |
| 2009/0273740 A1 | 11/2009 | Yoshizawa |
| 2009/0311519 A1 | 12/2009 | Nagata et al. |

FOREIGN PATENT DOCUMENTS

| | | |
|---|---|---|
| CN | 1314671 A | 9/2001 |
| CN | 1551712 A | 12/2004 |
| CN | 1720136 A | 1/2006 |
| CN | 101050846 A | 10/2007 |
| EP | 0284939 A2 | 10/1988 |
| EP | 1529812 A1 | 5/2005 |
| EP | 1 599 076 A1 | 11/2005 |
| JP | 63-305587 | 12/1988 |
| JP | 06-342969 | 12/1994 |
| JP | 9-123343 A | 5/1997 |
| JP | 2001-034190 | 2/2001 |
| JP | 2001-267376 A | 9/2001 |
| JP | 2005-199481 A | 7/2005 |
| JP | 2005-286275 | 10/2005 |
| JP | 2006-104504 A | 4/2006 |
| JP | 2006-108270 A | 4/2006 |
| JP | 2007-129208 A | 5/2007 |
| JP | 2007-186586 A | 7/2007 |
| JP | 2007-223312 A | 9/2007 |
| KR | 10-2003-0074429 A | 9/2003 |
| KR | 10-2007-0088611 A | 8/2007 |
| WO | WO 2007/020697 A | 2/2007 |
| WO | WO-2007/102691 A1 | 9/2007 |
| WO | WO 2007/132529 A1 | 11/2007 |

* cited by examiner

100a

- 130a
- 125a
- 120a
- 110a

100b

- 130b
- 125b
- 120b
- 110b
- 120b
- 125b
- 130b

FLEXIBLE FILM AND DISPLAY DEVICE COMPRISING THE SAME

This application claims priority from Korean Patent Application No. 10-2007-0140184 filed on Dec. 28, 2007 in the Korean Intellectual Property Office, the disclosure of which is incorporated herein by reference in its entirety.

BACKGROUND OF THE INVENTION

1. Field of the Invention

The present invention relates to a flexible film, and more particularly, to a flexible film which includes a dielectric film and a metal layer whose thicknesses are at a ratio of 1:3 to 1:10, and can thus contribute to the improvement of peel strength, dimension stability, and tensile strength.

2. Description of the Related Art

With recent improvements in flat panel display technology, various types of flat panel display devices such as a liquid crystal display (LCD), a plasma display panel (PDP), and an organic light-emitting diode (OLED) have been developed. Flat panel display devices include a driving unit and a panel and display images by transmitting image signals from the driving unit to a plurality of electrodes included in the panel.

Printed circuit boards (PCBs) may be used as the driving units of flat panel display devices. That is, PCBs may apply image signals to a plurality of electrodes included in a panel and thus enable the panel to display images.

SUMMARY OF THE INVENTION

The present invention provides a flexible film which can contribute to the improvement of peel strength, dimension stability, and tensile strength by limiting the ratio of the thicknesses of a dielectric film and a metal layer.

According to an aspect of the present invention, there is provided a flexible film including a dielectric film; and a metal layer disposed on the dielectric film, wherein the ratio of the thickness of the metal layer to the thickness of the dielectric film is about 1:3 to 1:10.

According to another aspect of the present invention, there is provided a flexible film including a dielectric film; a metal layer disposed on the dielectric film and including circuit patterns printed thereon; and an integrated circuit (IC) chip disposed on the metal layer, wherein the ratio of the thickness of the metal layer to the thickness of the dielectric film is about 1:3 to 1:10 and the IC chip is connected to the circuit patterns.

According to another aspect of the present invention, there is provided a display device including a panel; a driving unit; and a flexible film disposed between the panel and the driving unit; wherein the flexible film includes: a dielectric film; a metal layer disposed on the dielectric film and including circuit patterns printed thereon; and an integrated circuit (IC) chip disposed on the metal layer and the ratio of the thickness of the metal layer to the thickness of the dielectric film is about 1:3 to 1:10.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

The present invention will hereinafter be described in detail with reference to the accompanying drawings in which exemplary embodiments of the invention are shown.

Figure 1A:
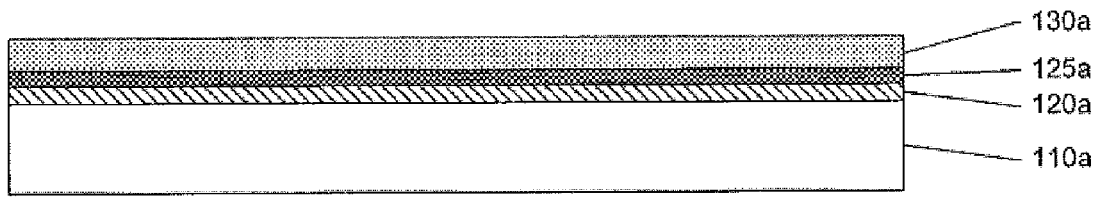
FIGS. 1A and 1B illustrate cross-sectional views of flexible films according to embodiments of the present invention.
Figure 1B:
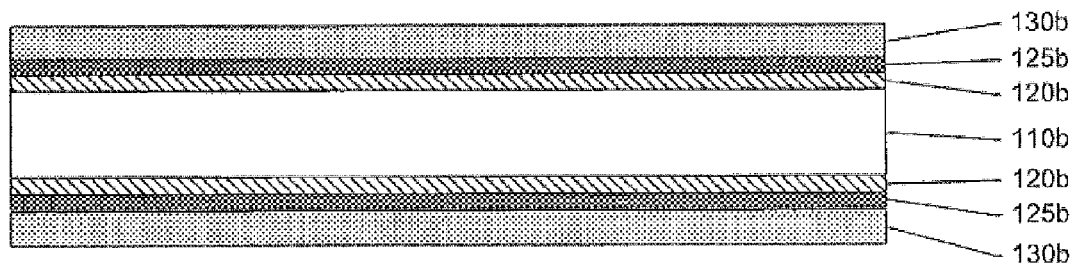

FIGS. 1A and 1B illustrate cross-sectional views of flexible films 100a and 100b, respectively, according to embodiments of the present invention. Referring to FIGS. 1A and 1B, the flexible films 100a and 100b transmit an image signal provided by a driving unit of a tape automated bonding (TAB)-type display device to an electrode on a panel of the TAB-type display device.

Each of the flexible films 100a and 100b may be formed by forming a metal layer on a dielectric film and printing circuit patterns on the metal layer. Circuit patterns of a flexible film used in a TAB-type display device may be connected to a circuit of a driving unit of the TAB-type display device or to an electrode on a panel of the TAB-type display device and may thus transmit a signal applied by the driving unit to the panel.

Referring to FIG. 1A, the flexible film 100a is single-sided. The flexible film 100a includes a dielectric film 110a and first, second and third metal layers 120a, 125a and 130a and thus has a triple-layer structure. The first metal layer 120a is disposed on the dielectric film 110a, the second metal layer 125a is disposed on the first metal layer 120a, and the third metal layer 130a is disposed on the second metal layer 125a.

The dielectric film 110a may include a dielectric polymer material such as polyimide, polyester, or a liquid crystal polymer. The first, second and third metal layers 120a, 125a and 130a may include nickel, gold, chromium or copper.

The first, second and third metal layers 120a, 125a and 130a may be formed through sputtering or plating. More specifically, the first, second and third metal layers 120a, 125a and 130a may be formed through sputtering, which involves the deposition of a metal. Alternatively, the first, second and third metal layers 120a, 125a and 130a may be formed through electroplating, which involves the use of a current, or electroless plating, which does not involve the use of a current. Alternatively, the first and second metal layers 120a and 125a may be formed through sputtering, and the third metal layer 130a may be formed through electroplating.

The first metal layer, which is a seed layer, is formed on the dielectric film 110a. The first metal layer 120a may include nickel, copper, gold or chromium, and particularly, an alloy of nickel and chromium. More specifically, the first metal layer 120a may be formed of an alloy of 93% nickel and 7% chromium or an alloy of 97% nickel and 3% chromium. If the first metal layer 120a is formed of an alloy of nickel and chromium, the thermal resistance of the flexible film 100a may increase.

The second metal layer 130a may be formed of gold or copper on the first metal layer 120a. More specifically, the second metal layer 130a may be formed of copper through electroplating.

Alternatively, the second metal layer 125a may be formed of copper on the first metal layer 120a through sputtering in order to improve the efficiency of electroplating for forming the third metal layer 130a. When the second metal layer 125a is formed of a highly-conductive metal such as copper on the first metal layer 120a, the resistance of the second metal layer 125a becomes low enough to smoothly perform electroplating.

Referring to FIG. 1B, the flexible film 100b is double-sided. The flexible film 100b includes a dielectric film 110b, two first metal layers 120b, which are formed on the top surface and the bottom surface, respectively, of the dielectric film 110b, two second metal layers 125b, which are formed on the respective first metal layers 120b, and two third metal layers 130b, which are formed on the respective second metal layers 125b. The first metal layers 120b may be formed through sputtering. The third metal layers 130b may be formed through electroplating. In the embodiment of FIG. 1B, like in the embodiment of FIG. 1A, the second metal layers 125b may be formed of copper through sputtering so as to smoothly perform electroplating and thus to reduce resistance.

Table 1 shows test results obtained from flexible films including a dielectric film having a thickness of 38 μm and a metal layer.

TABLE 1

| Thickness of Metal Layer:Thickness of Dielectric Film | Flexibility | Peel Strength |
|---|---|---|
| 1:1.4 | X | ⊚ |
| 1:1.5 | X | ○ |
| 1:2 | X | ○ |
| 1:3 | ○ | ○ |
| 1:6 | ○ | ○ |
| 1:8 | ○ | ○ |
| 1:10 | ○ | ○ |
| 1:11 | ○ | X |
| 1:12 | ⊚ | X |
| 1:13 | ⊚ | X |

Referring to Table 1, the ratio of the sum of the thicknesses of the first metal layer 120a, the second metal layer 125a, and the third metal layer 130a to the thickness of the dielectric film 110a may be 1:3 to 1:10. If the sum of the thicknesses of the first metal layer 120a, the second metal layer 125a, and the third metal layer 130a is less than one tenth of the thickness of the dielectric film 110a, the peel strength of the metal layer may decrease, and thus, the metal layer may be easily detached from the dielectric film 110a or the stability of the dimension of the metal layer may deteriorate, thereby making it difficult to form fine circuit patterns.

On the other hand, if the sum of the thicknesses of the first metal layer 120a, the second metal layer 125a, and the third metal layer 130a is greater than two thirds of the thickness of the dielectric film 110a, the flexibility of the flexible film 100a may deteriorate, and thus, the reliability of the flexible film 100a may decrease.

This directly applies to a double-sided flexible film at FIG. 1B

Table 2 shows test results obtained from flexible films having first and second metal layers and a third metal layer having a thickness of 9 μm.

TABLE 2

| Sum of Thicknesses of First and Second Metal Layers:Thickness of Third Metal Layer | Efficiency of Electroplating | Peel Strength |
|---|---|---|
| 1:40 | X | ○ |
| 1:50 | ○ | ○ |
| 1:80 | ○ | ○ |
| 1:100 | ○ | ○ |
| 1:120 | ○ | ○ |
| 1:180 | ○ | ○ |
| 1:200 | ○ | ○ |
| 1:210 | ○ | X |
| 1:220 | ○ | X |

Referring to Table 2, the first metal layer 120a, the second metal layer 125a, and the third metal layer 130a may be formed so that the ratio of the sum of the thicknesses of the first metal layer 120a and the second metal layer 125a to the thickness of the third metal layer 130a car become 1:50 to 1:200. If the ratio of the sum of the thicknesses of the first metal layer 120a and the second metal layer 125a to the thickness of the third metal layer 130a is higher than 1:200, the peel strength of the third metal layer 130a may decrease, or the thermal resistance of the flexible film 100a may deteriorate. On the other hand, if the ratio of the sum of the thicknesses of the first metal layer 120a and the second metal layer 125a to the thickness of the third metal layer 130a is lower than 1:50, resistance may increase, and thus, the efficiency of electroplating for forming the third metal layer 130a may decrease.

This directly applies to a double-sided flexible film at FIG. 1B

The dielectric film 110a or 110b may be formed to a thickness of 15-40 μm so as to have high tensile strength, high thermal resistance and a high thermal expansion coefficient, and the sum of the thicknesses of the first metal layer 120a, the second metal layer 125a, and the third metal layer 130a or the sum of the thicknesses of the first metal layers 120b, the second metal layers 125b, and the third metal layers 130b may be 4-13 μm. More specifically, the dielectric film 110a or 110b may have a thickness of 35-38 μm the first metal layer 120a or the first metal layers 120b may have a thickness of 7-20 nm, the second metal layer 125a or the second metal layers 125b may have a thickness of 80-90 nm, and the third metal layer 130a or the third metal layers 130b may have a thickness of 9 μm.

Circuit patterns may be formed on the flexible film 100a or 110b through etching. In order to protect the circuit patterns, a protective film may be attached onto the flexible film 100a or 100b. The protective film may be formed of a dielectric material such as polyethylene terephthalate (PET).

An adhesive layer may be used to attach the protective film onto the flexible film 100a or 100b. The adhesive layer may include epoxy and may be formed to a thickness of 2-10 μm, If the adhesive layer has a thickness of less than 2 μm, the protective film may easily be detached from the flexible film 110a or 110b during the transportation or the storage of the flexible film 100a or 100b. If the adhesive layer has a thickness of more than 10 μl, the manufacturing cost of the flexible film 100a or 100b and the time taken to manufacture the flexible film 100a or 100b may increase, and it may be very difficult to remove the protective film.

Figure 2A:
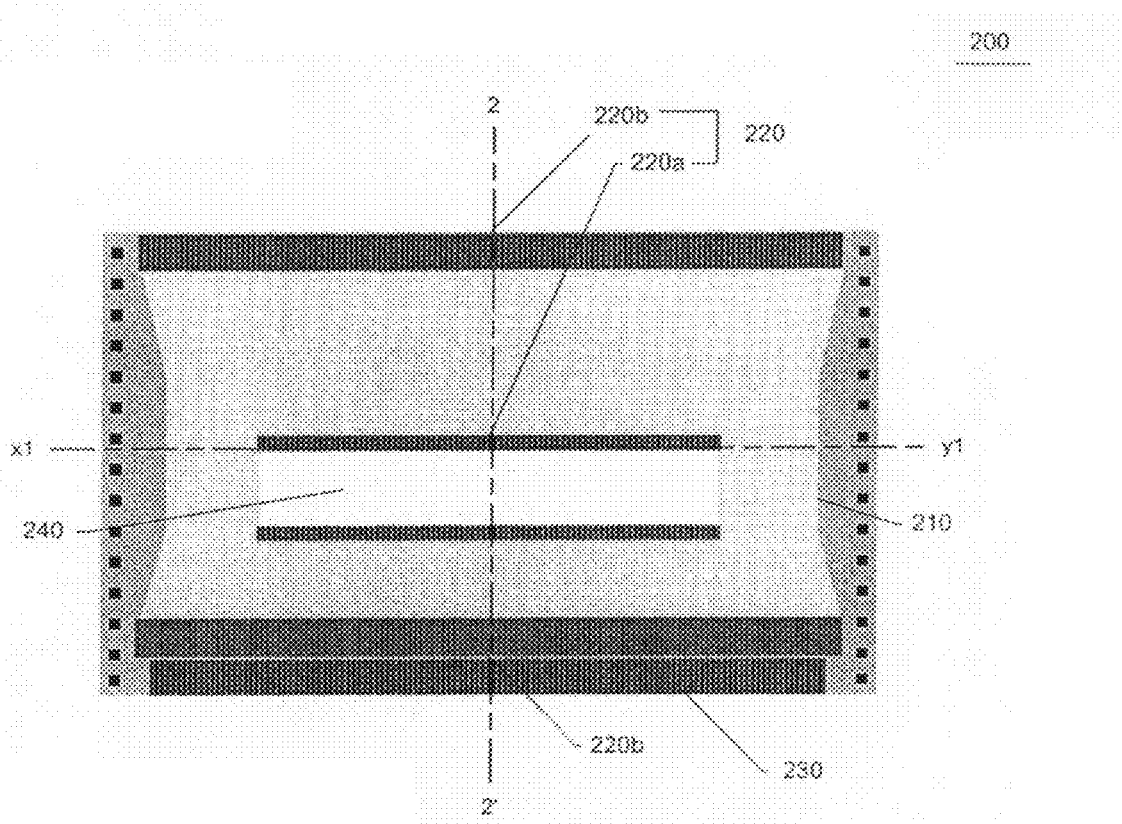
FIGS. 2A and 2B illustrate diagrams of a tape carrier package (TCP) comprising a flexible film according to an embodiment of the present invention.
Figure 2B:
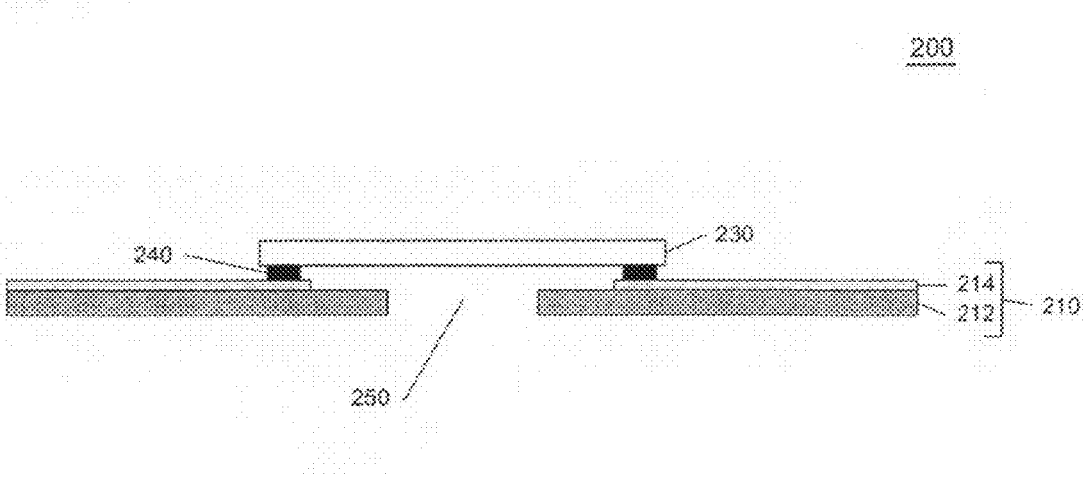

FIGS. 2A and 2B illustrate a plan view and a cross-sectional view, respectively, of a tape carrier package (TCP) 200 including a flexible film 210 according to an embodiment of the present invention. Referring to FIG. 2A, the TCP 200 includes the flexible film 210, circuit patterns 220, which are formed on the flexible film 210, and an IC 230.

The flexible film 210 may include a dielectric film and a metal layer. The metal layer may include a first metal layer, which is formed on the dielectric film, a second metal layer, which is formed on the first metal layer, and a third metal layer, which is formed on the second metal layer.

The first metal layer may be formed through sputtering and may include nickel chromium gold or copper. More specifically, the first metal layer may be formed of an alloy of 93% nickel and 7% chromium or an alloy of 97% nickel and 3% chromium. If the first metal layer is formed of an alloy of nickel and chromium, the thermal resistance of the flexible film 210 may increase.

The second metal layer may be formed on the first metal layer through sputtering. More specifically, the second metal layer 130a may be formed of copper, thereby increasing the efficiency of electroplating for forming the third metal layer.

The circuit patterns 220 are printed on the metal layer of the flexible film 210. The circuit patterns 220 include inner leads 220a, which are connected to the IC 230, and outer leads 220b, which are connected to a driving unit or a panel of a display device. The inner leads 220a may be connected to the IC 230 through inner lead bonding (ILB) pads, and the outer leads 220b may be connected to a driving unit or a panel of a display device through outer lead bonding (OLB) pads.

FIG. 2B illustrates a cross-sectional view taken along line 2-2' of FIG. 2A. Referring to FIG. 2B, the TCP 200 includes the flexible film 210, the IC 230 and gold bumps 240, which connect the flexible film 210 and the IC 230.

The flexible film 210 may include a dielectric film 212 and a metal layer 214, which is formed on the dielectric film 212. The dielectric film 212, which is a base film of the flexible film 210, may include a dielectric material such as polyimide, polyester or a liquid crystal polymer. The dielectric film 212 may be formed to a thickness of 15-40 μm so as to have high flexibility, high thermal resistance, and high peel strength with respect to the metal layer 214.

The metal layer 214 may be a thin film formed of a conductive metal. The metal layer 214 may have a triple-layer structure including first, second and third metal layers. In this case, the first meal layer may include at least one of nickel, chromium, gold and copper and may be formed on the dielectric film 212, the second metal layer may be formed of a highly-conductive metal such as copper on the first metal layer, and the third metal layer may be formed of gold or copper on the second metal layer.

The metal layer 214 may be formed through sputtering or plating. More specifically, the first and second metal layers may be formed through sputtering, and the third metal layer may be formed through plating, and particularly, electroplating. In the case of forming the third metal layer through electroplating, the efficiency of electroplating may be improved by forming the second metal layer of copper through sputtering so as to reduce resistance.

The ratio of the thickness of the metal layer 214 to the thickness of the dielectric film 212 may be 1:3 to 1:10. If the thickness of the metal layer 214 is less than one tenth of the thickness of the dielectric film 212, the peel strength and the dimension stability of the metal layer 214 may deteriorate. Thus, the metal layer 214 may be easily detached from the dielectric film 212, or it may be difficult to form fine circuit patterns on the metal layers 214. On the other hand, if the thickness of the metal layer 214 is greater than one third of the thickness of the dielectric film 212, the thickness of the flexible film 210 may increase, and the flexibility of the TCP 200 may deteriorate.

The dielectric film 212 may have a thickness of 15-40 μm, and the metal layer 214 may have a thickness of 4-13 μm. The ratio of the sum of the thicknesses of the first and second metal layers to the thickness of the third metal layer may be 1:50 to 1:200. In this case, it is possible to improve the efficiency of electroplating and optimize peel strength and thermal resistance. The first metal layer may have a thickness of 7-20 nm, the second metal layer may have a thickness of 80-90 nm, and the metal layer 214 may have a thickness of 4-13 μm.

The IC 230 transmits an image signal provided by a driving unit of a display unit, to which the TCP 200 is connected, to a panel of the display device. More specifically, the IC 230 may be connected to the circuit patterns 220 on the metal layer 214 through ILB pads and may thus transmit an image signal provided by the driving unit to the panel. In the embodiment of FIGS. 2A and 2B, the IC 230 and the inner leads 220a of the circuit patterns 220 are connected through the gold bumps 240.

The gold bumps 240 are electrodes that connect the IC 230 and the inner leads 220a. Nickel bumps or tin bumps may be used, instead of the gold bumps 240, to connect the IC 230 and the inner leads 220a. However, the gold bumps 240 may be more suitable than nickel or tin bumps in terms of the stability of circuits. The gold bumps 240 may be formed on the IC 230 through plating.

Referring to FIG. 2B, the TCP 200 includes a device hole 250, which is disposed in an area in which the IC 230 is disposed. The device hole 250 is formed through the flexible film 210. After the formation of the device hole 250, flying leads are formed on circuit patterns 220 near the device hole 250, and the IC 230 is connected to the flying leads, thereby completing the formation of the TCP 200. The flying leads may be plated with tin, thereby forming tin electrodes. By applying heat or ultrasonic waves to the tin electrodes, a gold-tin bond may be generated between the tin electrodes and the gold bumps 240.

Figure 3A:
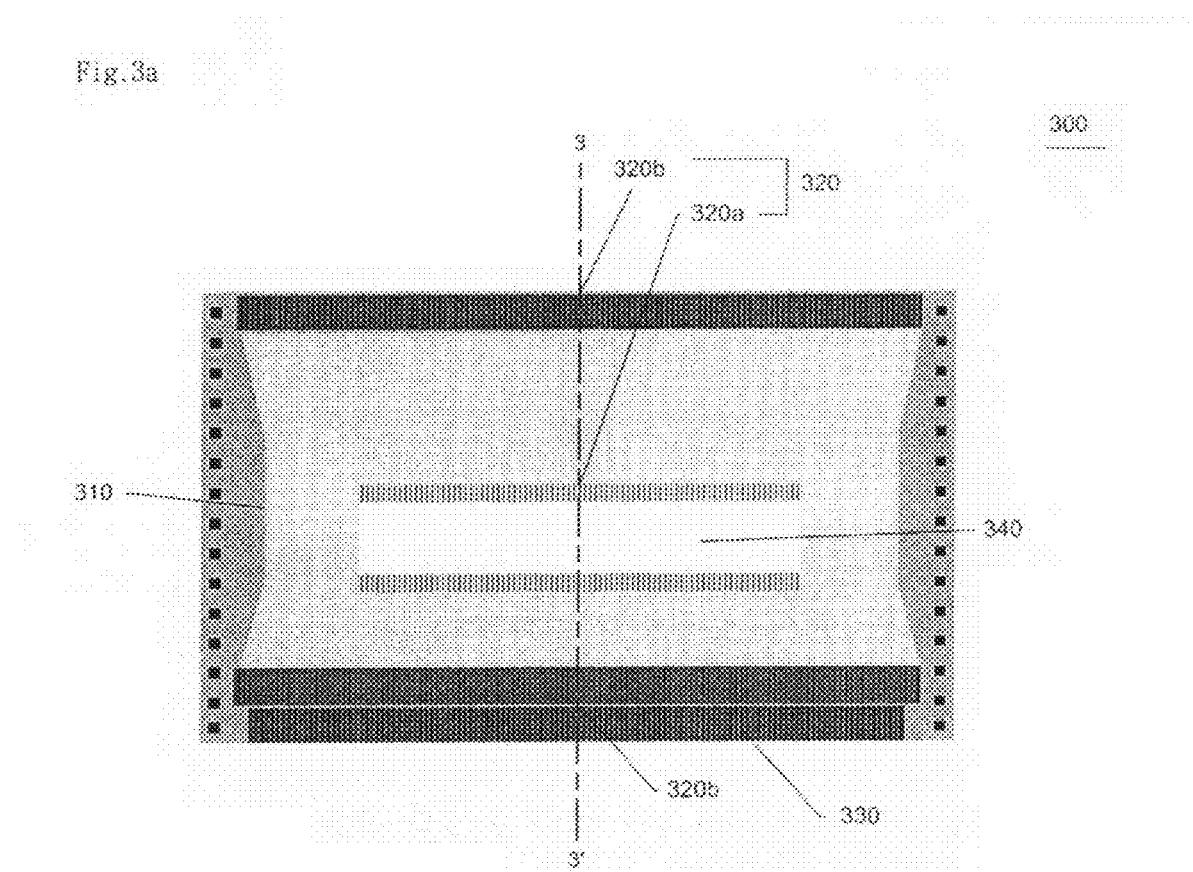
FIGS. 3A and 3B illustrate diagrams of a chip-on-film (COF) comprising a flexible film according to an embodiment of the present invention.
Figure 3B:
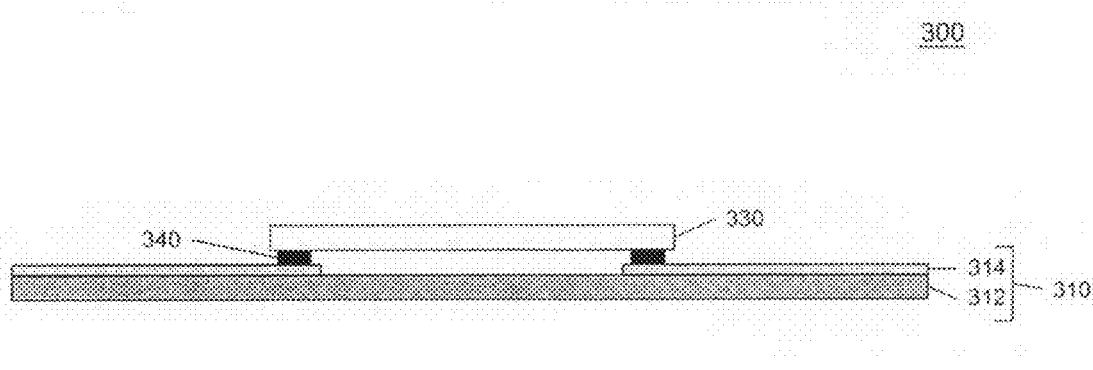

FIGS. 3A and 3B illustrate a plan view and a cross-sectional view, respectively, of a chip-on-film (COF) 300 including a flexible film 310 according to an embodiment of the present invention. Referring to FIG. 3A, the COF 300 includes the flexible film 310, circuit patterns 320, which are formed on the flexible film 310, and an IC 330, which is attached onto the flexible film 310 and is connected to the circuit patterns 320.

The flexible film 310 may include a dielectric film and a metal layer, which is formed on the dielectric film. The circuit patterns 320 may be printed on the metal layer. The circuit patterns 320 include inner leads 320a, which are connected to the IC 330, and outer leads 320b, which are connected to a driving unit or a panel of a display device. The outer leads 320b may be connected to the driving unit or the panel by an anisotropic conductive film (ACF).

More specifically, the outer leads 320b may be connected to a driving unit or a panel of a display device through OLB pads, and the inner leads 320a may be connected to the IC 330 through ILB pads. The IC 330 and the inner leads 320a may be connected by bumps including gold or nickel.

The metal layer of the flexible film 310 may include a first metal layer, which is formed on the dielectric film, a second metal layer, which is formed on the first metal layer, and a third metal layer, which is formed on the second metal layer. The first and second metal layers may be formed through sputtering. The first metal layer may include at least one of nickel, chromium, gold or copper. More specifically, the first metal layer may be formed of an alloy of 93% nickel and 7% chromium or an alloy of 97% nickel and 3% chromium, thereby improving the thermal resistance of the COF 300.

The second metal layer may be formed of copper through sputtering. When the second metal layer is formed of a highly-conductive metal such as copper, the efficiency of electroplating for forming the third metal layer is improved. In consideration of peel strength and electric resistance of the flexible film, the first metal layer may be formed to a thickness of 7-20 nm, and the second metal layer may be formed to a thickness of 80-90 nm.

The third metal layer may include a highly-conductive metal such as copper. After the formation of the second metal layer, the third metal layer may be formed by immersing a flexible film including the second metal layer in an electroplating solution containing copper ions, and applying a current to the flexible film so as to extract the copper ions as copper. The third metal layer may be formed to a thickness of 4-13 μm in order to secure high peel strength and facilitate the fabrication of circuit patterns.

FIG. 3B illustrates a cross-sectional view taken along line 3-3' of FIG. 3A.

Referring to FIG. 3B, the COF 300 includes the flexible film 310, the IC 330, which is connected to the circuit patterns 320, and gold bumps 340, which connect the IC 330 and the circuit patterns 320. The flexible film 310 includes a dielectric film 312 and a metal layer 314, which is formed on the dielectric film 312. The circuit patterns 320 are formed on the metal layer 314.

The dielectric film 312 is a base film of the flexible film 310 and may include a dielectric material such as polyimide, polyester, or a liquid crystal polymer. In particular, the dielectric film 312 may be formed of polyimide because polyimide has excellent peel strength and thermal resistance properties. The dielectric film 312 may be formed to a thickness of 15-40 μm so as to have appropriate peel strength with respect to the metal layer 314 and have appropriate flexibility.

The metal layer 314 is a thin film formed of a conductive metal. The metal layer 214 may include a first metal layer, which is formed on the dielectric film 312, a second metal layer, which is formed on the first metal layer, and a third metal layer, which is formed on the second metal layer. The first metal layer may include nickel, chromium, gold or copper and may be formed through sputtering. The second metal layer may be formed of a highly-conductive metal such as copper through sputtering. The third metal layer may be formed of gold or copper through electroplating. The thickness of the metal layer 314 may account for one tenth to one third of the thickness of the dielectric film 312.

If the thickness of the metal layer 314 is less than one tenth of the thickness of the dielectric film 312, the peel strength of the metal layer 214 may deteriorate, and thus, the metal layer 314 may be easily detached from the dielectric film 312. On the other hand, if the thickness of the metal layer 314 is greater than one third of the thickness of the dielectric film 312, the flexibility of the flexible film 310 may deteriorate.

The IC 330 is connected to the inner leads 320*a* of the circuit patterns 320 and transmits image signals provided by a driving unit of a display device to a panel of the display device. The pitch of the inner leads 320*a* may vary according to the resolution of a display device to which the COF 300 is connected. The inner leads 320*a* may have a pitch of about 30 μm. The IC 330 may be connected to the inner leads 320*a* through the gold bumps 340.

Referring to FIG. 3B, the COF 300, unlike the TCP 200, does not have any device hole 250. Therefore, the COF 300 does not require the use of flying leads and can thus achieve a fine pitch. In addition, the COF 300 is very flexible, and thus, there is no need to additionally form slits in the COF 300 in order to make the COF 300 flexible. Therefore, the efficiency of the manufacture of the COF 300 can be improved. For example, leads having a pitch of about 40 μm may be formed on the TCP 200, and leads having a pitch of about 30 μm can be formed on the COF 300. Thus, the COF 300 is suitable for use in a display device having a high resolution.

Figure 4:
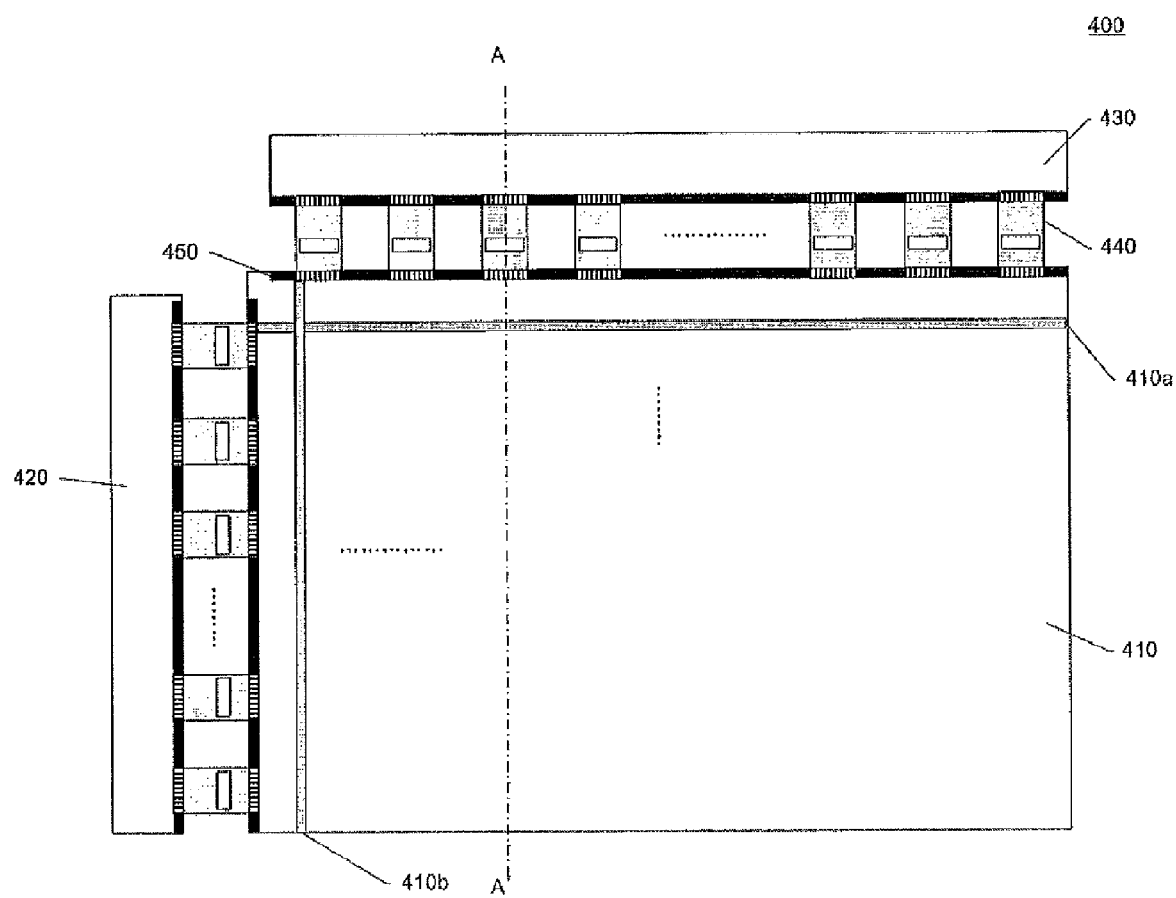
FIG. 4 illustrates diagram of a display device according to an embodiment of the present invention.

FIG. 4 illustrate diagram of a display device according to an embodiment of the present invention.

Referring to FIG. 4 the display device 400 according to an embodiment of the present invention may include a panel 410, which displays an image, a driving unit 420 and 430, which applies an image signal to the panel 410, a flexible film 440, which connects the panel 410 and the driving unit 420 and 430, and conductive films 450, which are used to attach the flexible film 440 to the panel 410 and to the driving unit 420 and 430. The display device 400 may be a flat panel display (FPD) such as a liquid crystal display (LCD), a plasma display panel (PDP) or an organic light-emitting device (OLED).

The panel 410 includes a plurality of pixels for displaying an image. A plurality of electrodes may be arranged on the panel 410 and may be connected to the driving unit 420 and 430. The pixels are disposed at the intersections among the electrodes. More specifically, the electrodes include a plurality of first electrodes 410*a* and a plurality of second electrodes 410*b*, which intersect the first electrodes 410*a*. The first electrodes 410*a* may be formed in row direction, and the second electrodes 410*b* may be formed in a column direction.

The driving units 420 and 430 may include a scan driver 420 and a data driver 430. The scan driver 420 may be connected to the first electrodes 410*a*, and the data driver 430 may be connected to the second electrodes 410*b*.

The scan driver 420 applies a scan signal to each of the first electrodes 410*a* and thus enables the data driver 430 to transmit a data signal to each of the second electrodes 410*b*. When the scan driver 420 applies a scan signal to each of the first electrodes 410*a*, a data signal can be applied to the first electrodes 410*a*, and an image can be displayed on the panel 400 according to a data signal transmitted by the data driver 430. Signals transmitted by the scan driver 420 and the data driver 430 may be applied to the panel 400 through the flexible films 440.

The flexible films 440 may have circuit patterns printed thereon. Each of the flexible films 440 may include a dielectric film, a metal layer, which is formed on the dielectric film, and an IC, which is connected to circuit patterns printed on the metal layer. Image signals applied by the driving units 420 and 430 may be transmitted to the first second electrodes 410*a* and the second electrodes 410*b* on the panel 410 through the circuit patterns and the IC of each of the flexible films 440. The flexible films 440 may be connected to the panel 410 and to the driving units 420 and 430 by the conductive films 450.

The conductive films 450 are adhesive thin films. The conductive films 450 may be disposed between the panel 410 and the flexible films 440, between the driving units 420 and 430 and the flexible films 440. The conductive films 450 may be anisotropic conductive films (ACFs).

Figure 5:
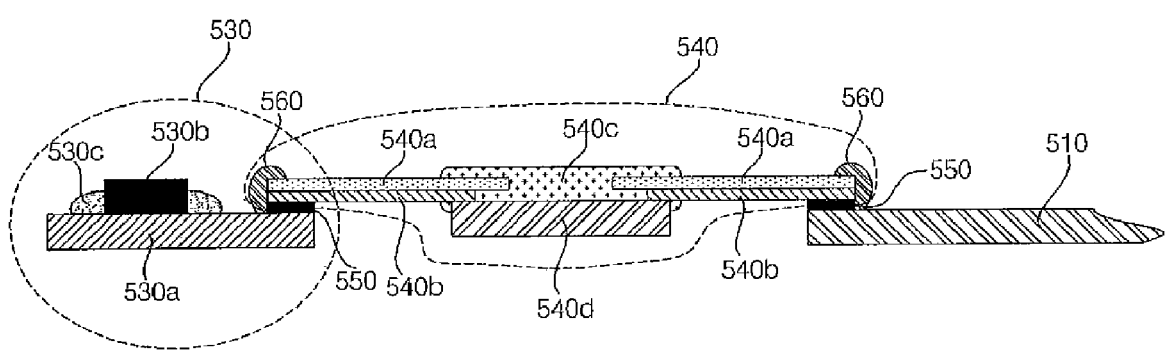
FIG. 5 illustrates cross-sectional view of the display device 400 in FIG. 4.

FIG. 5 is a cross-sectional view taken along line A-A' of the display device 400 in FIG. 4.

With reference to FIG. 5, the display device 500 comprises the panel 510 displaying an image, the data driver 530 that applies an image signal to the panel 510, the flexible film 540 connecting with the data driver 530 and the panel 510, and the conductive films 550 that electrically connects the flexible film 540 to the data driver 530 and the panel 510.

According to the embodiment of the present invention, the display device 500 may further comprise a resin 560 sealing up portions of the flexible film 540 contacting the conductive films 550. The resin 560 may comprise an insulating material and serve to prevent impurities that may be introduced into the portions where the flexible film 540 contacting the conductive films 550, to thus prevent damage of a signal line of the flexible film 540 connected with the panel 510 and the data driver 530, and lengthen a life span.

Although not shown, the panel 510 may comprise a plurality of scan electrodes disposed in the horizontal direction and a plurality of data electrodes disposed to cross the scan electrodes. The data electrodes disposed in the direction A-A' are connected with the flexible film 540 via the conductive film 550 as shown in FIG. 5 in order to receive an image signal applied from the data driver 530 and thus display a corresponding image.

The data driver 530 includes a driving IC 530b formed on a substrate 530a and a protection resin 530c for protecting the driving IC 530b. The protection resin 530c may be made of a material with insulating properties and protects a circuit pattern (not shown) formed on the substrate 530a and the driving IC 530b against impurities that may be introduced from the exterior. The driving IC 530b applies an image signal to the panel 510 via the flexible film 540 according to a control signal transmitted from a controller (not shown) of the display device 500.

The flexible film 540 disposed between the panel 510 and the data driver 530 includes polyimide film 540a, metal film 540b disposed on the polyimide films 540a, an IC 540c connected with a circuit pattern printed on the metal film 540b, and a resin protection layer 540d sealing tip the circuit pattern and the IC 540c.

Figure 6:
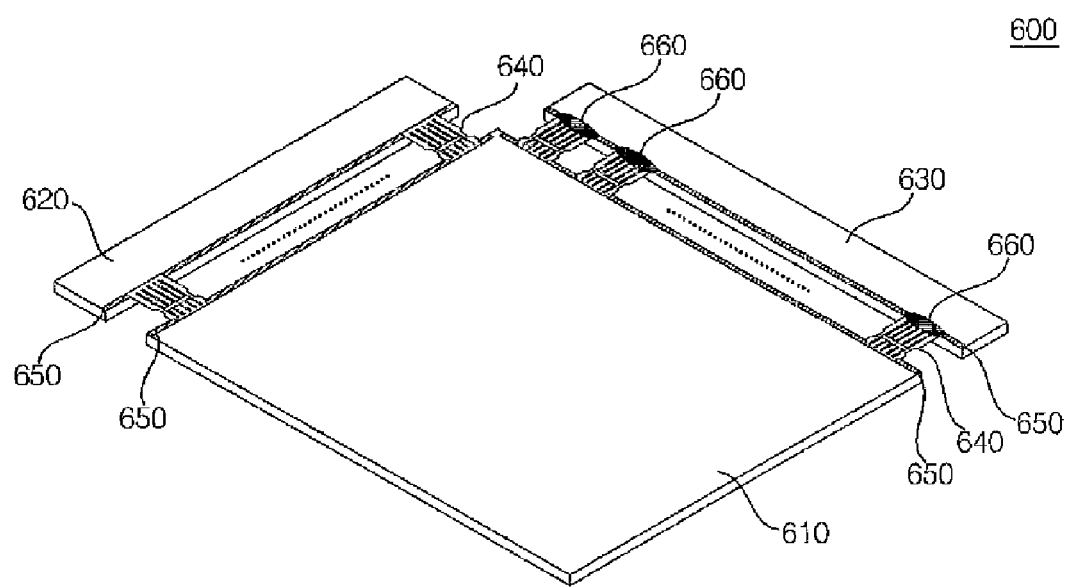
FIG. 6 illustrates diagram of a display device according to an embodiment of the present invention.

FIG. 6 illustrates diagram of a display device according to an embodiment of the present invention.

When the flexible films 640 are attached with the panel 610 and the driving units 620 and 630 through the conductive films 650, the flexible films 640 attached with the conductive films 650 can be sealed with the resin 660. With reference to FIG. 6e, because the portions of the flexible films 640 attached to the conductive films 650 can be sealed with the resin 660, impurities that may be introduced from the exterior can be blocked.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
   a panel;
   a driving unit; and
   a flexible film disposed between the panel and the driving unit;
   wherein the flexible film comprises:
      a dielectric film;
      a metal layer disposed on the dielectric film and including circuit patterns printed thereon; and
      an integrated circuit (IC) chip disposed on the metal layer and a ratio of a thickness of the metal layer to a thickness of the dielectric film is about 1:3 to 1:10,
   wherein the metal layer further comprises:
      a first metal layer disposed on the dielectric film,
      a second metal layer disposed on the first metal layer, and
      a third metal layer disposed on the second metal layer, and
   wherein a ratio of a sum of a thickness of the first and second metal layers to a thickness of the third metal layer is about 1:50 to 1:200.

2. The display device of claim 1, wherein the panel comprises:
   a first electrode; and
   a second electrode which intersects the first electrode,
   wherein the first and second electrodes are connected to the circuit patterns.

3. The display device of claim 1, further comprising a conductive film connecting at least one of the panel and the driving unit to the flexible film.

4. The display device of claim 3, wherein the conductive film is an anisotropic conductive film (ACF).

5. The display device of claim 1, further comprising a resin sealing up a portion of the flexible film contacting the conductive film.

* * * * *